(12) United States Patent
Koo et al.

(10) Patent No.: US 6,744,687 B2
(45) Date of Patent: Jun. 1, 2004

(54) SEMICONDUCTOR MEMORY DEVICE WITH MODE REGISTER AND METHOD FOR CONTROLLING DEEP POWER DOWN MODE THEREIN

(75) Inventors: Kie Bong Koo, Chungcheongbuk-do (KR); Young Do Hur, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 40 days.

(21) Appl. No.: 10/331,378

(22) Filed: Dec. 30, 2002

(65) Prior Publication Data

US 2003/0210600 A1 Nov. 13, 2003

(30) Foreign Application Priority Data

May 13, 2002 (KR) ................. 10-2002-0026183

(51) Int. Cl.[7] .............. G11C 7/00; G11C 8/00
(52) U.S. Cl. ................... 365/226; 365/233
(58) Field of Search ............... 365/226, 227, 365/228, 229, 233

(56) References Cited

U.S. PATENT DOCUMENTS

| | | | | |
|---|---|---|---|---|
| 5,197,034 A | * | 3/1993 | Fandrich et al. | 365/227 |
| 5,267,218 A | * | 11/1993 | Elbert | 365/226 |
| 5,388,265 A | | 2/1995 | Volk | |
| 5,663,918 A | * | 9/1997 | Javanifard et al. | 365/226 |
| 5,748,914 A | | 5/1998 | Barth et al. | |
| 5,822,246 A | * | 10/1998 | Taub et al. | 365/229 |
| 5,845,139 A | | 12/1998 | Fischer et al. | |
| 6,088,290 A | | 7/2000 | Ohtake et al. | |
| 6,141,292 A | | 10/2000 | Lee et al. | |
| 6,366,521 B1 | * | 4/2002 | Roohparvar | 365/226 |
| 6,512,715 B2 | * | 1/2003 | Okamoto et al. | 365/227 |
| 6,515,929 B1 | * | 2/2003 | Ting et al. | 365/226 |
| 6,560,158 B2 | * | 5/2003 | Choi et al. | 365/226 |

FOREIGN PATENT DOCUMENTS

| | | |
|---|---|---|
| JP | 1166849 | 3/1999 |
| JP | 0090666 | 3/2000 |

* cited by examiner

Primary Examiner—Trong Phan
(74) Attorney, Agent, or Firm—Ladas & Parry (57) ABSTRACT

Disclosed are a semiconductor memory device with a mode register that prevents the semiconductor device from undesirably entering into a deep power down mode during the beginning of a power up and a method for controlling a deep power down mode therein. An internal power supply voltage generator generates an internal power supply voltage of the semiconductor memory device. A clock buffer buffers external clock and clock enable signals to generate internal clock and clock enable signals. A command decoder generates an intermediate deep power down mode entry signal or a mode register setting signal. A mode register setting latch circuit latches the mode register setting signal from the command decoder. A deep power down mode controller generates a final deep power down mode entry signal. A semiconductor memory device is accordingly prevented from undesirably entering into a deep power down mode during beginning of a power up.

20 Claims, 4 Drawing Sheets

SEMICONDUCTOR MEMORY DEVICE WITH MODE REGISTER AND METHOD FOR CONTROLLING DEEP POWER DOWN MODE THEREIN

BACKGROUND OF THE INVENTION

1. Field of the Invention

The present invention relates to a semiconductor memory device, and more particularly to a semiconductor memory device with a mode register and a method for controlling both an entry into and a release from a deep power down (referred to as a "DPD" hereinafter) in the semiconductor memory device.

2. Description of the Prior Art

As generally known in the art, with the increase in the use of portable devices such as personal digital assistants or notebook computers, demand has risen for low power memory. A dynamic random access memory (referred to as a "DRAM" hereinafter) tends to use an external power supply of 2.5 V instead of a conventional external power supply of 3.3 V, and has a data input/output signal of 1.8 V instead of a conventional data input/output signal of 3.3 V, in order to embody the low power memory. Low power DRAMs having a self refresh cycle adjustment function and a partial self refresh function have been developed. The self refresh cycle adjustment function is a function which adjusts a self refresh cycle using the characteristic of the semiconductor memory device that a data duration time of a data cell varies according to a change in its temperature. The partial self refresh function is a function which does not refresh a total cell array but partially refreshes only necessary parts of the cell array.

A conventional DRAM typically includes an active mode and a standby mode as normal operation modes. The standby mode lowers a current driving performance of an internal power supply voltage generator as a low power mode. However, in order to further decrease power consumption, DRAMs operating in the DPD mode have been developed. The power consumption in the DPD operation mode is less than that in the standby operation mode. In such DRAMs, the current driving performance of the internal power supply voltage generator is not simply lowered, the internal power supply voltage generator does not operate at all, and only a clock buffer for receiving a clock signal operates, thereby minimizing power consumption of the DRAMs.

A conventional DRAM enters the DPD mode in synchronization with a clock signal CLK based on a predetermined combination of various different command signals, for example, when a clock enable signal CKE is at a low level, a row address strobe signal RASB and a column address strobe signal CASB are at high levels, and a write enable signal WEB and a chip select signal CSB are at low levels. When the clock enable signal CKE goes to a high level, the conventional DRAM is released from the DPD mode. After the release from the DPD mode, a normal operation is performed through a power sequence for a predetermined time, for example, 200 μs. At the beginning of a power up, the clock enable signal CKE, the row address strobe signal RASB, the column address strobe signal CASB, the write enable signal WEB, and the chip select signal CSB are supplied from outside together with a power supply signal. Since circumstances of the CKE, RASB, CASB, WEB, and CSB signals are different from one another, ramp_up slopes thereof become different from one another. At any time during the beginning of power up, a case in which the levels of these signals satisfy the conditions for an entry into the DPD mode as described above can occur. In that case, an undesirable entry into the DPD mode may happen. Internal power supply is turned off, so that the semiconductor memory device does not perform a normal operation.

SUMMARY OF THE INVENTION

Accordingly, the present invention has been made to solve the above-mentioned problems occurring in the prior art, and an object of the present invention is to provide a semiconductor memory device with a mode register that prevents the semiconductor memory device from undesirably entering into an DPD mode during the beginning of a power up.

Another object of the present invention is to provide a method for controlling a DPD mode in a semiconductor memory device with a mode register that stably performs an entry into and a release from a DPD mode in the semiconductor memory device.

In accordance with an aspect of the present invention, there is provided a semiconductor memory device with a mode register, the semiconductor memory device comprising: an internal power supply voltage generator for generating an internal power supply voltage of the semiconductor memory device based on an external power supply voltage when the external power supply voltage is applied to the internal power supply voltage generator; a clock buffer for receiving and buffering external clock and clock enable signals in order to generate internal clock and clock enable signals; a command decoder for receiving the internal clock and clock enable signals from the clock buffer, for receiving an external command signal, and for generating either an intermediate deep power down mode entry signal instructing the semiconductor memory device to enter into a deep power down mode or a mode register setting signal commanding a setting of the mode register according to a predetermined combination of the internally received clock and clock enable signals with the received external command signals; a mode register setting latch circuit for latching the mode register setting signal from the command decoder when the mode register setting signal is received after a stabilization of the external power supply voltage; and a deep power down mode controller for receiving the intermediate deep power down mode entry signal from the command decoder, for generating a final deep power down mode entry signal when the deep power down mode controller receives the mode register setting signal from the command decoder, and for outputting the finally generated deep power down mode entry signal to the internal power supply generator.

Preferably, the clock buffer circuit operates by an external power supply voltage, and generates the deep power down mode release signal instructing the semiconductor memory device to be released from a deep power down mode using the external received clock enable signal, and for providing the generated deep power down mode release signal to the deep power down mode controller. The internal power supply voltage generator generates an external power supply voltage detecting signal having a first level when the external power supply voltage is stabilized, and outputs the generated external power supply detecting signal to the mode register setting latch circuit. The mode register setting latch circuit latches the mode register setting signal from the command decoder when the external power supply detecting signal reaches the first level.

The mode register setting latch circuit includes a first inverter for receiving and inverting the external power supply detecting signal; a first NAND gate for receiving an output signal of the first inverter as a first input signal; a second inverter for receiving and inverting the mode register setting signal; a second NAND gate for NANDing an output signal of the second inverter and an output signal of the first NAND gate to generate an output signal to be become a second input signal of the first NAND gate; and a third inverter for receiving and inverting an output signal of the first NAND gate and outputting the inverted signal as an output signal of the mode register setting latch circuit.

The deep power down mode controller includes a third NAND gate for NANDing the intermediate deep power down mode entry signal from the command decoder and an output signal of the mode register setting latch circuit; and a fourth inverter for receiving and inverting an output signal of the third NAND gate. The deep power down mode controller includes a fifth inverter for receiving and inverting an output signal of the fourth inverter; an NMOS transistor including a gate for receiving an output signal of the fifth inverter and a source being grounded; a latch section including first and second input terminals which are connected to a drain of the NMOS transistor and an output terminal of the fourth inverter, respectively; and a NOR gate for receiving the deep power down mode release signal and an output signal of the latch section as two inputs.

In accordance with another aspect of the present invention, there is provided a semiconductor memory device with a mode register, the semiconductor memory device comprising: a deep power down decoder for receiving external clock, clock enable, and command signals and for generating an intermediate deep power down mode entry signal instructing the semiconductor memory device to enter into a deep power down mode in response to a predetermined combination of the received external clock, clock enable, and command signals; a mode register setting decoder for receiving the external clock and command signals, and for generating a mode register setting signal instructing a setting of the mode register in response to a predetermined combination of the received external clock and command signals; a mode register setting latch circuit for latching the mode register setting signal from the mode register when the mode register setting signal is received after a stabilization of an external power supply; and a deep power down mode controller for receiving the intermediate deep power down mode entry signal from the deep power down decoder, and for generating a final deep power down mode entry signal when the mode register setting signal is received from the command decoder.

In accordance with a further aspect of the present invention, there is provided a method for controlling a deep power down mode in a semiconductor memory device with a mode register, the method comprising the steps of: (i) receiving external clock, clock enable, and command signals, and generating an intermediate deep power down mode entry signal instructing the semiconductor memory device to enter into a deep power down mode or a mode register setting signal commanding a setting of the mode register according to a predetermined combination of the received internal clock and clock enable with the external command signals; (ii) latching the mode register setting signal when the mode register setting signal is received after a stabilization of the external power supply voltage; and (iii) generating a final generated deep power down mode entry signal when the intermediate deep power down entry and mode register setting signals are received.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 1:
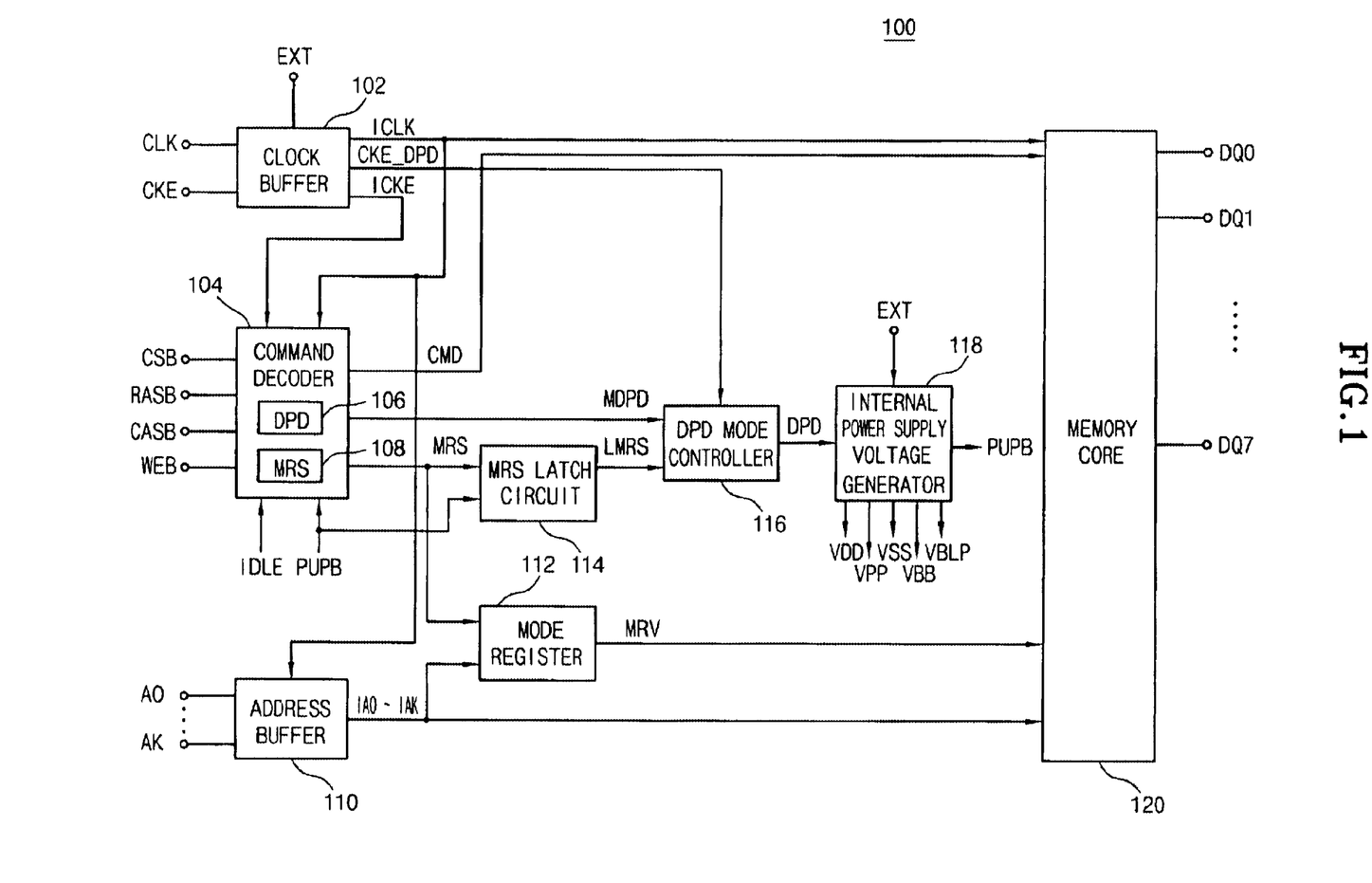
FIG. 1 is a block diagram showing a configuration of a semiconductor memory device with a mode register according to an embodiment of the present invention.

FIG. 1 shows a configuration of a semiconductor memory device 100 with a mode register according to an embodiment of the present invention. The semiconductor memory device 100 includes a clock buffer 102, a command decoder 104, an address buffer 110, a mode register 112, an MRS latch circuit 114, a DPD mode controller 116, an internal power supply voltage generator 118, and a memory core 120.

In FIG. 1, the clock buffer 102 receives and buffers an external clock signal CLK and an external clock enable signal CKE. The clock buffer 102 generates an internal clock signal ICLK and an internal clock enable signal ICKE based on the externally buffered clock signal and clock enable signals CLK and CKE, and provides the internal clock signal ICLK and the internal clock enable signal ICKE to the command decoder 104 and the memory core 120. The clock buffer circuit 102 generates a DPD mode release signal CKE_DPD indicating a release from a deep power down mode using the externally received clock enable signal CKE, and provides the generated DPD mode release signal CKE_DPD to the DPD mode controller 116. The clock buffer circuit 102 does not operate by an internal power supply voltage generated from the internal power supply voltage generator 118 but operates by an external power supply voltage. Accordingly, even though the semiconductor memory device 100 enters a DPD mode and the internal power supply voltage generator 118 is turned off, the clock buffer circuit 102 operates normally and can receive the external clock signal CLK and the external clock enable signal CKE and can generate the DPD mode release signal CKE_DPD.

The command decoder 104 receives a chip select signal CSB, a row address strobe signal RASB, a column address strobe signal CASB, and a write enable signal WEB from a command buffer (not shown). The command decoder 104 also receives the internal clock signal ICLK and the internal clock enable signal ICKE from the clock buffer 102 and an external power supply voltage detecting signal PUPB from the internal power supply voltage generator 118. The external power supply voltage detecting signal PUPB is a signal indicating a detection of a voltage of an external power supply EXT at the beginning of a power up. The external power supply voltage detecting signal PUPB is increased in proportion to a power supply voltage VDD. The external power supply voltage detecting signal PUPB is a signal which falls to a low level when the power supply voltage VDD becomes greater than a predetermined level. The command decoder 104 receives an internal interpreting signal IDLE of a precharge command signal. The precharge command signal is applied before the semiconductor memory device enters a DPD mode. The receipt of the internal interpreting signal IDLE indicates that an internal precharge is completed. The command decoder 104 generates various different command signals for controlling an operation of a memory in accordance with the received signals CSB, RASB, CASB, WEB, ICLK, ICKE, and PUPB.

The DPD decoder 106 and the MRS decoder 108, as shown in FIG. 1, are either incorporated in the command decoder 104 or are formed separately therefrom. The DPD decoder 106 receives the internal clock signal ICLK and the internal clock enable signal ICKE from the clock buffer 102. The DPD decoder 106 receives the chip select signal CSB, the row address strobe signal RASB, the column address strobe signal CASB, and the write enable signal WEB from the command buffer (not shown) The DPD decoder 106 generates an intermediate DPD mode entry signal MDPD indicating an entry into a deep power down mode according to a predetermined combination of the internally received clock and clock enable signals ICLK and ICKE, and the received chip select, row address strobe, column address strobe, and write enable signals CSB, RASB, CASB, and WEB. The DPD decoder 106 provides the generated intermediate DPD mode entry signal MDPD to a DPD mode controller 116. An MRS decoder 108 receives the chip select signal CSB, the row address strobe signal RASB, the column address strobe signal CASB from the command buffer (not shown), and the external power supply voltage detecting signal PUPB and the internal clock signal ICLK from the clock buffer 102. The MRS decoder 108 generates an MRS setting signal MRS indicating a setting of the mode register 112 according to a predetermined combination of the received chip select, row address strobe, and column address strobe signals CSB, RASB, and CASB, and the externally received power supply voltage detecting signal PUPB and the internally received clock signal ICLK. The MRS decoder 108 provides the MRS signal to the mode register 112. Preferably, the MRS decoder 108 generates the MRS signal MRS only when the external power supply voltage detecting signal PUPB has a low level. Accordingly, this prevents an MRS signal from being generated undesirably during the beginning of the power up, allowing a stable operation.

The address buffer 110 receives and buffers external address signals A0, A1, . . . , Ak to generate internal address signals IA0, IA1, . . . , IAk. The address buffer 110 provides the internally generated address signals TA0, IA1, . . . , IAk to the mode register 112 and a memory core 120. The mode register 112 is a register which performs an external setting of an operation mode including a burst length in a burst mode of a synchronous dynamic random access memory (SDRAM) and a latency from an input of a command signal to outputs of data. The mode register 112 receives the MRS signal MRS from the MRS decoder 108 and the internal address signals IA0, IA1, . . . , TAk from the address buffer 110. When the MRS signal is at a predetermined level, for example, a high level, the mode register 112 receives the internal address signals IA0, IA1, . . . , TAk and changes values stored therein based on the internally generated address signals IA0, IA1, . . . , IAk. The changed values instruct an operation mode of the semiconductor memory device 100 such as a burst length and a latency of the semiconductor memory device 100. After a stabilization of the external power supply voltage, when the MRS signal MRS from the MRS decoder 108 is provided to the MRS latch circuit 114, the MRS latch circuit 114 latches the MRS signal MRS to generate a latched MRS signal LMRS. The MRS latch circuit 114 receives the MRS signal MRS from the command decoder 104 and the external power supply voltage detecting signal PUPB from the internal power supply voltage generator 118.

The DPD mode controller 116 receives the latched MRS signal LMRS from the MRS latch circuit 114 and the intermediate DPD mode entry signal MDPD from the command decoder 104. The DPD mode controller 116 receives the DPD mode release signal CKE_DPD from the clock buffer 102 and generates a final DPD mode entry signal DPD, and provides the final DPD mode entry signal DPD to the internal power supply voltage generator 118. The internal power supply voltage generator 118 generates various different power supply voltages, namely, a power supply voltage VDD, a boosting voltage VPP, a ground voltage VSS, a substrate voltage VBB, and a bit line precharge voltage VBLP. The internal power supply voltage generator 118 also generates and outputs the external power supply voltage detecting signal PUPB. As stated above, the external power supply voltage detecting signal PUPB is a signal indicating detection of a voltage of an external power supply EXT at the beginning of a power up. The external power supply voltage detecting signal PUPB is increased in proportion to the power supply voltage VDD. The external power supply voltage detecting signal PUPB is a signal which falls to a low level when the power supply voltage VDD becomes greater than a predetermined level.

Whenever the DPD mode release signal CKE_DPD is at a high level, the DPD mode controller 116 outputs a final DPD mode entry signal DPD of a low level, so that the semiconductor memory device 100 does not enter the DPD mode. However, when the DPD mode release signal CKE_DPD is at a low level, a level of the final DPD mode entry signal DPD is determined according to the latched MRS signal LMRS and the intermediate DPD mode entry signal MDPD. Namely, when the DPD mode release signal CKE_DPD is at a low level, and both of the latched MRS signal LMRS and the intermediate DPD mode entry signal MDPD are at high levels, the DPD mode controller 116 outputs the final DPD entry signal DPD of a high level. The final DPD mode entry signal DPD of a high level turns off the internal power supply voltage generator 118. Accordingly, an internal power supply necessary for an operation of the semiconductor memory device 100 can not be used, so that most structural elements of the semiconductor memory device 100 do not operate. However, the clock buffer 102 operates by an external power supply. Accordingly, even though the semiconductor memory device 100 enters the DPD mode, the clock buffer 102 operates to receive the clock signal CLK and the clock enable signal CKE. The clock buffer 102 also generates the internal clock signal ICLK, the internal clock enable signal ICKE, and the DPD mode release signal CKE_DPD using the received clock and clock enable signals CLK and CKE.

The memory core 120 receives the internal clock signal ICLK from the clock buffer 102. The memory core 120 receives a command signal CMD from the command decoder 104. Also, the memory core 120 receives a mode signal MRV designating all the various operation modes from the mode register 112. The memory core 120 receives the internal address signals A0, A1, . . . , Ak from the address buffer 110. The memory core 120 outputs read data through data input/output pins DQ0, DQ1, . . . , DQ7 based on the received internal clock signal ICLK, command signal CMD, mode signal MRV, and internal address signals A0, A1, . . . , Ak. The memory core 120 records data inputted to the data input/output pins DQ0, DQ1, . . . , DQ7 therein.

Figure 2:
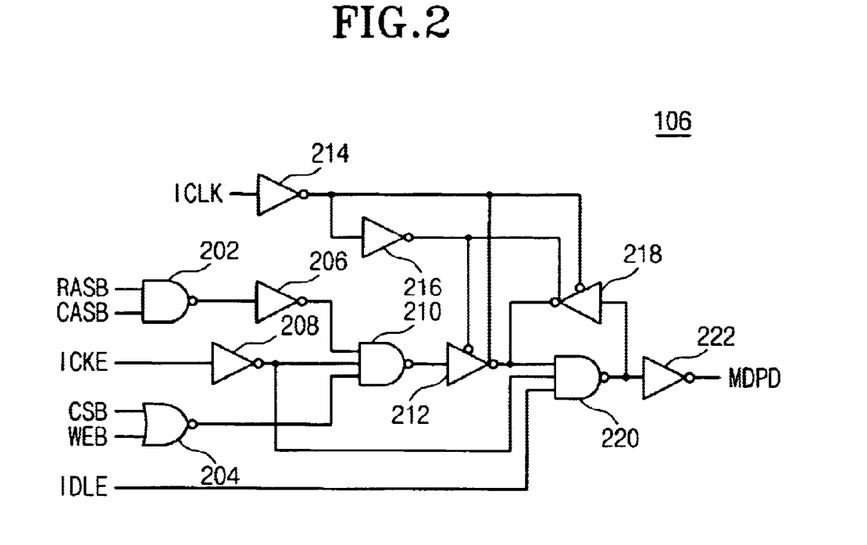
FIG. 2 is a circuitry diagram showing one example of a DPD decoder shown in FIG. 1.
Figure 3:
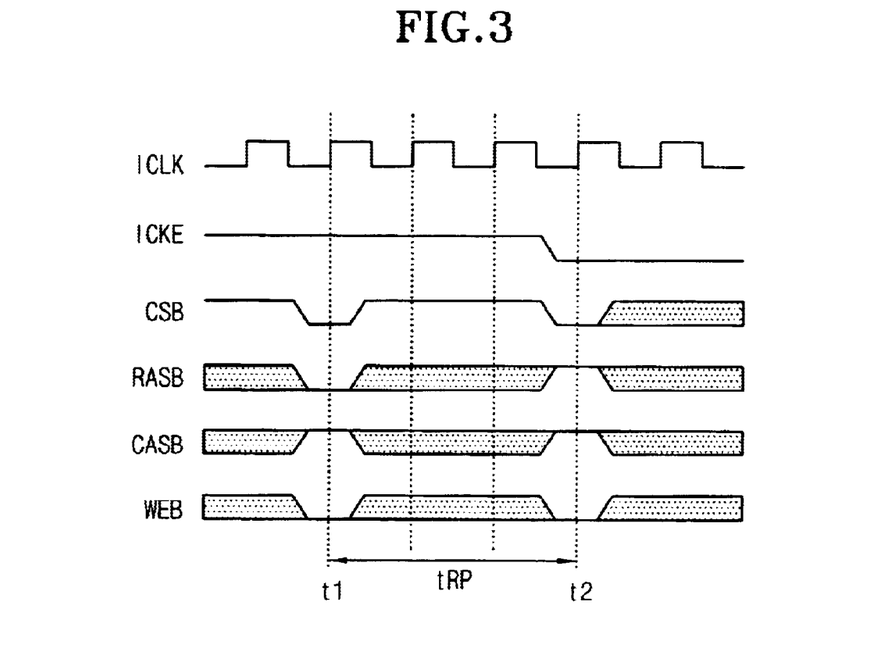
FIG. 3 is a timing chart of signals generated in the operation of the DPD decoder shown in FIG. 2.

FIG. 2 is a circuitry diagram showing one example of the DPD decoder 106 shown in FIG. 1. FIG. 3 is a timing chart of signals generated in the operation of the DPD decoder 106 shown in FIG. 2. As shown in FIG. 2, the DPD decoder 106 includes NAND gates 202, 210, and 220, a NOR gate 204, inverters 206, 208, 214, 216, and 222, and clocked inverters 212 and 218. As stated above, when of the internal clock enable signal ICKE, the chip select signal CSB, and the write enable signal WEB are all at low levels, and the row address strobe signal RASB and the column address strobe signal CASB are both at high levels, the DPD decoder 106 generates the intermediate DPD mode entry signal MDPD of a high level in synchronization with the internal clock signal ICLK. In the operation of the DPD decoder 106, here it is assumed that an internal precharge operation of the semiconductor memory device 100 is completed so that the internal interpreting signal IDLE of a precharge command signal has a high level.

The operation of the DPD decoder 106 will be described in detail with reference to FIGS. 2 and 3. When a predetermined period tRP of time elapses from a time t1, referring to FIG. 3, the internal interpreting signal IDLE of a precharge command signal is inverted from a low level to a high level. The time t1 is an input time of the precharge command signal. At time 2, since both the row address strobe signal RASB and the column address strobe signal CASB are at high levels, the NAND gate 202 outputs a low level signal. The low level signal from the NAND gate 202 is inverted into a high level signal by the inverter 206. The high level signal from the inverter 206 is supplied to a 3 input NAND gate 210 as a first input signal thereof. The internal clock enable signal ICKE, initially of a low level, is inverted into a high level signal by the inverter 208. The high level signal from the inverter 208 is supplied to the 3 input NAND gate 210 as a second input signal thereof. Since both the chip select signal CSB and the write enable signal WEB are at low levels, the NOR gate 204 outputs a high level signal and supplies the high level signal to the 3 input NAND gate 210 as a third input signal thereof. Since all of three inputs of the 3 input NAND gate 210 are at high levels, the NAND gate 210 outputs a low level signal and provides the low level signal to an input terminal of the clocked inverter 212.

An output signal of the inverter 214 is supplied to a non-inverting control terminal of the clocked inverter 212, and an output signal of the inverter 216 is supplied to an inverting control terminal thereof. When the internal clock signal ICLK is at a low level, accordingly, the clocked inverter 212 inverts an output signal of the NAND gate 210. An output signal of the clocked inverter 212 is provided to the 3 input NAND gate 220 as a first input signal thereof. The internal clock enable signal ICKE, initailly of a low level, is inverted into a high level signal by the inverter 208. The high level signal from the inverter 208 is provided to the 3 input NAND gate 220 as a second input signal thereof. The internal interpreting signal IDLE of a high level is provided to the 3 input NAND gate 220 as a third input signal thereof.

Since all of three inputs of the 3 input NAND gate 220 are at high levels, the NAND gate 220 outputs a low level signal and provides the low level signal to an input terminal of the inverter 222. The inverter 222 inverts the low level signal from the NAND gate 220 into a high level signal and outputs it as the intermediate DPD mode entry signal MDPD. An output signal of the inverter 214 is provided to an inverting control terminal of the clocked inverter 218 and an output signal of the inverter 214 is provided to a non-inverting control terminal thereof. When the internal clock signal ICLK is at a high level, accordingly, the clocked inverter 218 feedbacks an output signal of the NAND gate 220 to an input terminal thereof. Referring to FIG. 3, at time t2, the intermediate DPD mode entry signal MDPD of a high level is generated by the DPD decoder 106 through the above procedures.

Figure 4:
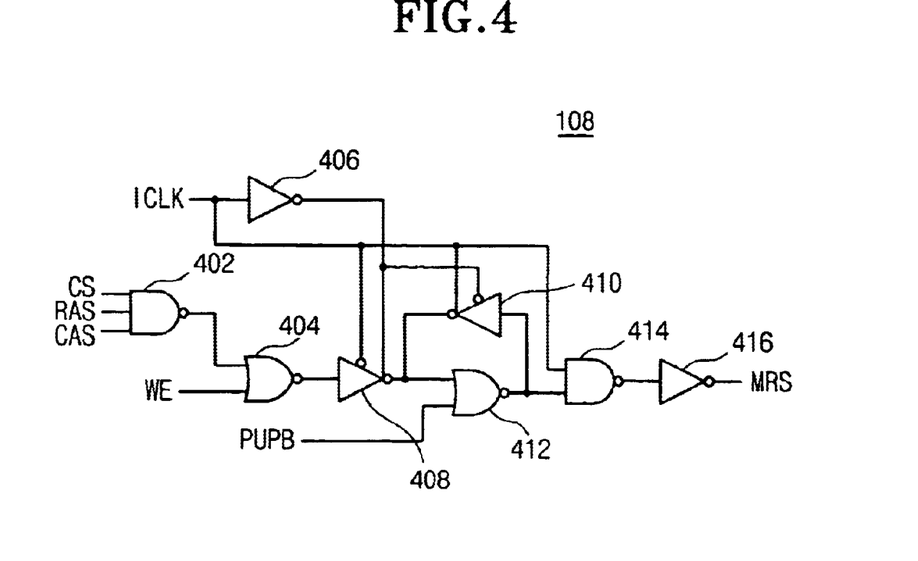
FIG. 4 is a circuitry diagram showing one example of a MRS decoder shown in FIG. 1.

FIG. 4 is a circuitry diagram showing one example of a MRS decoder 108 shown in FIG. 1. As shown in FIG. 4, the MRS decoder 108 includes NAND gates 402 and 414, NOR gates 404 and 412, inverters 406 and 416, and clocked inverters 408 and 410. In FIG. 4, a signal CS means the signal whose logical value is in inverse relation to the chip select signal CSB. A row address signal RAS means the signal whose logical value is in inverse relation to the row address strobe signal RASB. A column address signal CAS means the signal whose logical value is in inverse relation to the column address strobe signal CASB. A signal WE means the signal whose logical value is in inverse relation to the write enable signal WEB.

At the beginning of power up, when the external power supply voltage detecting signal PUPB is at a high level, the NOR gate 412 outputs a low level signal, so that the NAND gate 414 outputs a high level signal and the inverter 416 outputs a low level signal as an output signal MRS of the MRS decoder 108, namely, the MRS signal. In other words, in a power up process, this prevents an high level signal MRS from being undesirably generated before a power supply is stabilized. The power supply is stabilized so that the external power supply voltage detecting signal PUPB goes to a low level. When the signal CS, row address signal RAS, and the column address signal CAS, all at high levels, and the signal WE at a low level are inputted to the MRS decoder 108, the MRS decoder 108 outputs the MRS signal MRS at a high level in synchronization with the internal clock signal ICLK.

The operation of the MRS decoder 108 will be described in detail with reference to FIG. 4. When all of the signal CS, row address signal RAS, and the column address signal CAS are at high levels as three inputs of the NAND gate 402, the NAND gate 402 outputs a low level signal and provides it to the NOR gate 404 as a first input signal thereof. Since both of the first input of the NOR gate 404 and the signal WE which is a second input thereof are at low levels, the NOR gate 404 outputs a high level signal an input terminal of the cloked inverter 408. Since an output signal of the inverter 406 is applied to a non-inverting control terminal of the clocked inverter 408 and the internal clock signal ICLK is directly applied to an inverting control terminal thereof. Accordingly, when the internal clock signal ICLK has a low level, the clocked inverter 408 is turned on and inverts a signal applied to an input terminal thereof, and outputs the inverted signal through an output terminal thereof. That is, when the internal clock signal ICLK goes to a low level, the clocked inverter 408 inverts an output signal of the NOR gate 404, initially at a high level, into a low level signal and outputs the low level signal to the NOR gate 412 as a first input signal thereof. Since both the first input signal of the NOR gate 412 and the external power supply voltage detecting signal PUPB, being the second input signal thereof, are at low levels, the NOR gate 412 outputs a high level signal to the NAND gate 414 as one input signal thereof. When the internal clock signal ICLK has a low level, the NAND gate 414 always has a high level signal regardless of the level of the output signal of the NOR gate 412. However, when the internal clock signal ICLK goes to a high level, the NAND gate 414 inverts the output signal of the NOR gate 412. Accordingly, in the case where the NOR gate 412 outputs a high level signal, when the internal clock signal ICLK goes to a high level, the NAND gate 414 outputs a low level signal. The low level signal from the NAND gate 414 is inverted into a high level signal by the inverter 416 and the high level signal is outputted as the MRS signal MRS. When the internal clock signal ICLK is at a high level, the clocked inverter 410 inverts the output signal of the NOR gate 412 and feeds it back to an input terminal of the NOR gate 412.

Figure 5:
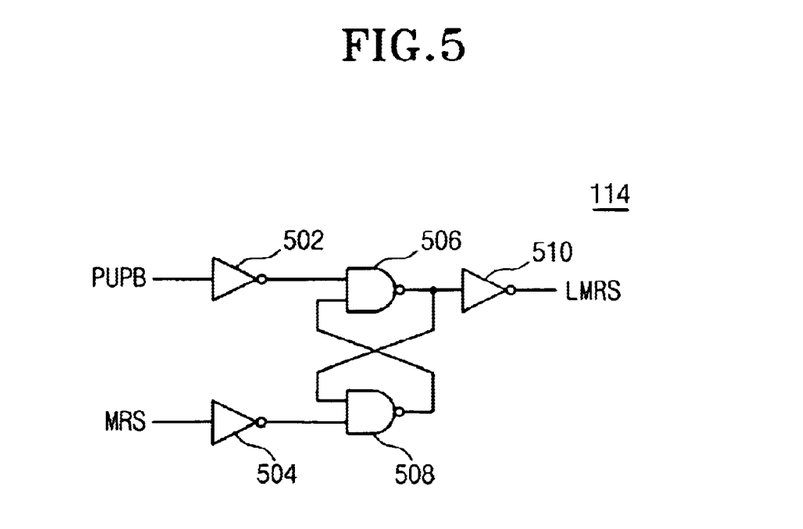
FIG. 5 is a circuitry diagram showing one example of an MRS latch circuit shown in FIG. 1.

FIG. 5 is a circuitry diagram showing one example of the MRS latch circuit 114 shown in FIG. 1. As shown in FIG. 5, the MRS latch circuit 114 includes inverters 502, 504, and 510, and NAND gates 506 and 508. The NAND gates 506 and 508 form a give-and-take relationship in such a way that the NAND gate 506 uses an output signal of the NAND gate 508 as a first input signal thereof and the NAND gate 508 uses an output signal of the NAND gate 506 as a first input signal thereof. The inverter 502 inverts the external power supply voltage detecting signal PUPB and provides the inverted signal to the NAND gate 506 as a second input signal thereof. The inverter 504 inverts the output signal of the MRS decoder 108, namely, the MRS signal MRS and provides an inverted signal to the NAND gate 508 as the second input signal thereof. As stated above, the output signal of the NAND gate 506 is provided as the first input signal of the NAND gate 508, and the output signal of the NAND gate 508 is provided as the first input signal of the NAND gate 506. The inverter 510 receives the output signal of the NAND gate 506 as an input signal thereof and inverts the output signal of the NAND gate 506, and outputs the inverted signal as an output signal of the MRS latch circuit 114, namely, a latched MRS signal LMRS.

The operation of the MRS latch circuit 114 will be described in detail with reference to FIG. 5. As stated above, the MRS signal MRS is maintained at a low level at the beginning of power up, but the external power supply voltage detecting signal PUPB is maintained at a high level for a predetermined period of time and eventually falls to a low level. While the MRS signal MRS is maintained at a low level and the external power supply voltage detecting signal PUPB is maintained at a high level, the inverter 502 inverts this high-level external power supply voltage detecting signal PUPB into a low level signal and supplies this low level signal to the second input terminal of the NAND gate 506. Consequently, the NAND gate 506 outputs a high level signal to the input terminal of the inverter 510 and the first input terminal of the NAND gate 508.

The inverter 510 inverts the high level signal inputted through the input terminal thereof into a low level signal, and outputs it as the latched MRS signal LMRS. The inverter 504 inverts the MRS signal MRS, initially at a low level, into a high level signal and provides this high level signal to the other input terminal of the NAND gate 508. Since high level signals are provided to two input terminals of the NAND gate 508, the NAND gate 508 outputs a low level signal to the other input terminal of the NAND gate 506. As stated above, while the MRS signal MRS is maintained at a low level, when the external power supply voltage detecting signal PUPB falls to a low level, the inverter 502 outputs a high level signal to the second input terminal of the NAND gate 506. However, since the first input signal of the NAND gate 506 provided from the output terminal of the NAND gate 508 is maintained at a low level, the output signal of the NAND gate 506 is maintained at a high level. Accordingly, while the MRS signal MRS is maintained at a low level, even though the external power supply voltage detecting signal PUPB is inverted from a high level to a low level, the latched MRS signal LMRS is maintained at a low level.

While the external power supply voltage detecting signal PUPB is maintained at a low level, when the MRS signal MRS goes to a high level, the inverter 504 outputs a low level signal to the second input terminal of the NAND gate 508. Consequently, the NAND gate 508 outputs a high level signal to the first input terminal of the NAND gate 506. At this time, since a high level signal is applied to a second input terminal of the NAND gate 506, the NAND gate 506 outputs a low level signal to the input terminal of the inverter 510 and the first input terminal of the NAND gate 508. The inverter 510 inverts the low level signal from the NAND gate 506 into a high level signal and outputs the high level signal as the latched MRS signal LMRS. In this state, when the MRS signal MRS is inverted to a low level, the inverter 504 outputs a high level signal to the second input terminal of the NAND gate 508. However, since the low level signal provided from the NAND gate 506 is applied to the first input terminal of the NAND gate 508, the output terminal of the NAND gate 508 is maintained at a high level. Accordingly, since the level of a signal applied to the second input terminal of the NAND gate 506 does not change, the inverter 510 continues to output the latched MRS signal LMRS of the high level. In other words, while the external power supply voltage detecting signal PUPB is maintained at a low level, even though the MRS signal MRS goes to a high level and returns to a low level, the latched MRS signal LMRS is maintained at a high level. Accordingly, it is indicated that a setting of a mode register has previously been performed in the semiconductor memory device 100.

Figure 6:
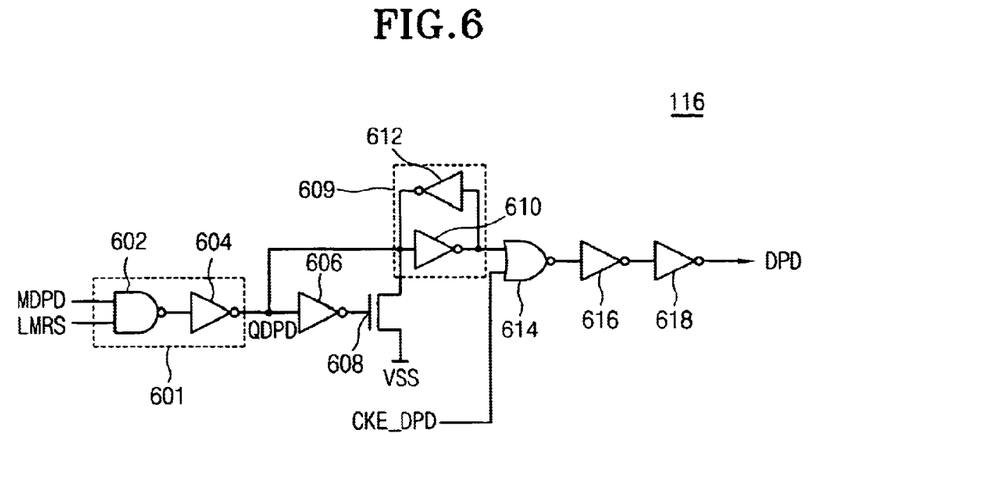
FIG. 6 is a circuitry diagram showing one example of a DPD mode controller shown in FIG. 1.

FIG. 6 is a circuitry diagram showing one example of a DPD mode controller 116 shown in FIG. 1. As shown in FIG. 6, the DPD mode controller 116 includes an NAND gate 602, inverters 604, 606, 610, and 612, an NMOS transistor 608, and a NOR gate 614. A block 601 ANDs the intermediate DPD mode entry signal MDPD from the DPD decoder 106 and the latched MRS signal LMRS from the MRS latch circuit 114 to generate a signal QDPD. A latch section 609 latches a voltage to be applied to a drain of the NMOS transistor 608. When the semiconductor memory device 100 enters a DPD mode, the DPD mode release signal CKE_DPD has a low level. However, when the semiconductor memory device 100 is released from the DPD mode, the DPD mode release signal CKE_DPD goes to a high level.

As described previously with reference to FIG. 5, before the mode register setting is performed, the latched MRS signal LMRS has a low level. However, after the mode register setting is performed, the latched MRS signal LMRS has a high level. Accordingly, before the mode register setting is performed, the NAND gate 602 outputs a high level signal to the inverter 604. The inverter 604 inverts the high level signal from the NAND gate 602 into a low level signal and outputs the inverted low level signal QDPD. Since this inverted low level signal QDPD is inverted into a high level signal by the inverter 606. The high level signal from the inverter 606 is applied to a gate of the NMOS transistor 608 in order to turn on the NMOS transistor 608. As shown in FIG. 6, the source of the NMOS transistor 608 is connected to the power supply voltage VSS, and a drain of the NMOS transistor 608 is connected to an input terminal of a latch section 609. When the NMOS transistor 608 is turned on, a ground voltage VSS of a low level is provided to the input terminal of the latch section 609. The low level signal from the NMOS transistor 608 is inverted into a high level signal by an inverter 610 of the latch section 609 and the high level signal is provided to the NOR gate 614. As stated above, when the semiconductor memory device 100 enters the DPD mode, the DPD mode release signal CKE_DPD is at a low level. Accordingly, the high level signal provided from the inverter 610 is inverted into a low level signal by the NOR gate 614. The low level signal from the NOR gate 614 is provided to the inverter 616. The inverter 616 inverts the low level signal from the NOR gate 614 into a high level signal and outputs the high level signal to the inverter 618. The inverter 618 inverts the high level signal from the inverter 616 to generate the final DPD mode entry signal DPD. That is, before performing the mode register setting, the final DPD mode entry signal DPD has a low level, so that the semiconductor memory device 100 does not enter the DPD mode.

While the external power supply voltage detecting signal PUPB is maintained at a high level, when the MRS signal MRS goes to a high level, causing the latched MRS signal LMRS to have a high level, the NAND gate 602 inverts the intermediate DPD mode entry signal MDPD generated by the DPD decoder 106 and provides the inverted signal to an input terminal of the inverter 604. As described above referring to FIG. 2, the DPD decoder 106 generates the intermediate DPD mode entry signal MDPD of the high level according to a predetermined combination of command signals to command entry into the DPD mode. In this case, since two input signals of the NAND gate 602, namely, the intermediate DPD mode entry signal MDPD and the latched MRS signal LMRS are at high levels, the NAND gate 602 outputs a low level signal to an input terminal of the inverter 604. The inverter 604 inverts the low level signal from the NAND gate 602 into a high level signal and outputs the high level signal as the signal QDPD. At this time, since the inverter 606 outputs a low level signal, the NMOS transistor 608 is turned off and the QDPD, at a high level, is latched by a latch section 609. An inverter 610 of the latch section 609 inverts this high level signal applied to an input terminal thereof into a low level signal and provides the low level signal to a first input terminal of the NOR gate 614. Since the DPD mode release signal CKE_DPD applied to a second input terminal of the NOR gate 614 is at a low level, the NOR gate 614 outputs a high level signal to the inverter 616. The inverters 616 and 618 buffer the high level signal from the NOR gate 614 and output the final DPD mode entry signal DPD of a high level. In other words, after the power supply is stabilized and the mode register setting is performed, when a predetermined combination of command signals is received from outside, the DPD mode controller 116 outputs the final DPD mode entry signal DPD of a high level, causing the semiconductor memory device 100 to enter the DPD mode. Therefore, the present invention prevents the semiconductor memory device from entering into the DPD mode at an undesirable time. In other words, it prevents faulty operation of the semiconductor memory device 100 at the beginning of power up.

As described above, the DPD mode release signal CKE_DPD functions to control a release from the DPD mode. When the DPD mode release signal CKE_DPD has a high level, the NOR gate 614 always outputs a low level signal regardless of a level of an output signal of the latch section 609, causing the final DPD mode entry signal DPD to always have a low level. In other words, when the DPD mode release signal CKE_DPD is at a high level, the final DPD mode entry signal DPD is at a low level, regardless of the levels of the intermediate DPD mode entry signal MDPD and the latched MRS signal LMRS, so that entry into the DPD mode becomes impossible. Accordingly, in order to enter the DPD mode, the DPD mode release signal CKE_DPD must have a low level. In the case where the DPD mode release signal CKE DPD is at the low level, as stated above, when both of the intermediate DPD mode entry signal MDPD and the latched MRS signal LMRS are at high levels, the final DPD mode entry signal DPD has a high level, which allows the semiconductor memory device 100 to enter into the DPD mode. In this state, when the DPD mode release signal CKE DPD goes to a high level, the NOR gate 614 outputs a low level signal regardless of the level of the output signal of the latch section 609, so that the final DPD mode entry signal DPD becomes low in level, thus performing the release from the DPD mode. That is, the DPD mode release signal CKE_DPD functions to instruct the semiconductor memory device to be released from the DPD mode.

Figure 7:
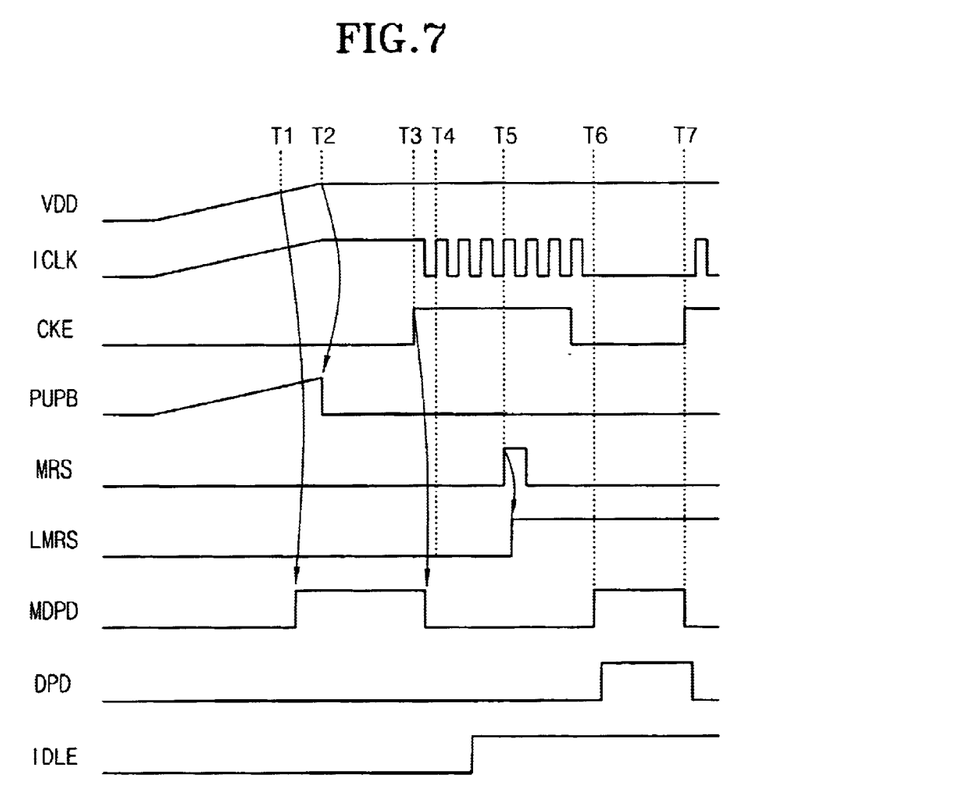
FIG. 7 is a timing chart of signals generated in the operation of the semiconductor memory device shown in FIG. 1.

FIG. 7 is a timing chart of signals generated in the operation of the semiconductor memory device 100 shown in FIG. 1. First of all, a power supply voltage VDD is increased by time T2 to have a predetermined slope. In the middle of the increase of the power supply voltage VDD, when a command signal received by the command decoder 104 satisfies predetermined conditions at time T1 by chance, the DPD decoder 106 generates the intermediate DPD mode entry signal MDPD of a high level. However, in this case, since the latched MRS signal LMRS outputted from the MRS latch circuit 114 has a low level, the DPD mode controller 116 outputs the final DPD mode entry signal DPD of a low level. Accordingly, even if by chance the DPD decoder 106, during the beginning of a power up, outputs the intermediate DPD mode entry signal MDPD at a high level, the semiconductor memory device 100 does not enter the DPD mode.

While the external power supply voltage detecting signal PUPB is increased in proportion to the power supply voltage VDD, when the power supply voltage VDD becomes a predetermined level, it goes to a low level at time T2. The MRS decoder 108 receives the external power supply voltage detecting signal PUPB. In the case where the external power supply voltage detecting signal PUPB is at a low level, when the MRS decoder 108 receives an external MRS command signal, it outputs the MRS signal MRS at a high level. The MRS latch circuit 114 also receives the external power supply voltage detecting signal PUPB. In the case where the external power supply voltage detecting signal PUPB is at a low level, when the MRS latch circuit 114 latches the high level MRS signal MRS from the MRS decoder 108.

When the clock enable signal CKE is inverted from a low level to a high level at time T3, the clock buffer 102 receives the clock signal CLK and generates the internal clock signal ICLK based on the received clock signal CLK. The clock buffer 102 provides the internal clock signal ICLK to the DPD decoder 106 of the command decoder 104. The DPD decoder 106 outputs the intermediate DPD mode entry signal MDPD of a low level in response to the internal clock signal ICLK from the clock buffer 102. When a precharge command signal is received at time T4, a precharge operation for a cell array of the memory core 120 is performed for a predetermined period of time. When the precharge operation is completed, the internal interpreting signal IDLE of the precharge command signal provided to the command decoder 104 becomes high in level. When an external MRS command signal is applied to the MRS decoder 108 at time T5, the MRS decoder 108 outputs the MRS signal MRS of a high level to the MRS latch circuit 114. Since the external power supply voltage detecting signal PUPB is at a low level, the MRS latch circuit 114 latches the MRS signal MRS from the MRS decoder 108 and outputs the latched MRS signal LMRS at a high level. Even though the MRS signal MRS provided to the MRS latch circuit 114 from the MRS decoder 108 is returned to a low level, the MRS latch circuit 114 continues to output the high level latched MRS signal LMRS.

In this state, a DPD entry command signal is provided to the DPD decoder 106 at time T6, the DPD decoder 106 outputs the intermediate DPD mode entry signal MDPD of the high level to the DPD mode controller 116. Prior to outputting the intermediate DPD mode entry signal MDPD of the high level, the clock enable signal CKE goes to a low level, so that the internal clock signal ICLK is not generated. At this time, since both of the intermediate DPD mode entry signal MDPD and the latched MRS signal LMRS applied to the DPD controller 116 have high levels, the DPD controller 116 outputs the final DPD mode entry signal DPD at a high level to the internal power supply voltage generator 118. This final DPD mode entry signal DPD turns off the internal power supply voltage generator 118, so that the semiconductor memory device 100 enters the DPD mode. When an external DPD release command signal is received at time T7, the clock enable signal CKE goes to a high level, causing the DPD mode release signal CKE_DPD to also become a high level signal. When the DPD mode release signal CKE_DPD is at a high level, as stated above with reference to FIG. 6, the final DPD mode entry signal DPD goes to a low level. This final DPD mode entry signal DPD turns on the internal power supply voltage generator 118 again, so that the semiconductor memory device is released from the DPD mode.

As mentioned above, the present invention prevents the semiconductor memory device from entering into a DPD mode undesirably during the beginning of a power up. Therefore, the entry into the DPD mode and a release from the DPD mode are stably performed.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A semiconductor memory device with a mode register, the semiconductor memory device comprising:
    an internal power supply voltage generator for generating an internal power supply voltage of the semiconductor memory device based on an external power supply voltage when the external power supply voltage is applied to the internal power supply voltage generator;
    a clock buffer for receiving and buffering external clock and clock enable signals in order to generate internal clock and clock enable signals;
    a command decoder for receiving the internal clock and clock enable signals from the clock buffer, for receiving an external command signal, and for generating an intermediate deep power down mode entry signal instructing the semiconductor memory device to enter into a deep power down mode or a mode register setting signal commanding a setting of the mode register according to a predetermined combination of the internally received clock and clock enable signals with the received external command signals;
    a mode register setting latch circuit for latching the mode register setting signal from the command decoder when the mode register setting signal is received, after a stabilization of the external power supply voltage; and
    a deep power down mode controller for receiving the intermediate deep power down mode entry signal from the command decoder, for generating a final deep power down mode entry signal when the deep power down mode controller receives the mode register setting signal from the command decoder, and for outputting the final generated deep power down mode entry signal to the internal power supply generator.

2. The semiconductor memory device as claimed in claim 1, wherein the clock buffer circuit operates by an external power supply voltage, and generates the deep power down mode release signal instructing the semiconductor memory device to be released from a deep power down mode using the external received clock enable signal, and for providing the generated deep power down mode release signal to the deep power down mode controller.

3. The semiconductor memory device as claimed in claim 1, wherein the internal power supply voltage generator generates an external power supply voltage detecting signal having a first level when the external power supply voltage is stabilized, and outputs the generated external power supply detecting signal to the mode register setting latch circuit.

4. The semiconductor memory device as claimed in claim 3, wherein the mode register setting latch circuit latches the mode register setting signal from the command decoder when the external power supply detecting signal is at the first level.

5. The semiconductor memory device as claimed in claim 3, wherein the mode register setting latch circuit includes:
    a first inverter for receiving and inverting the external power supply detecting signal;
    a first NAND gate for receiving an output signal of the first inverter as a first input signal;
    a second inverter for receiving and inverting the mode register setting signal;
    a second NAND gate for NANDing an output signal of the second inverter and an output signal of the first NAND gate in order to generate an output signal as a second input signal of the first NAND gate; and
    a third inverter for receiving and inverting an output signal of the first NAND gate and outputting the inverted signal as an output signal of the mode register setting latch circuit.

6. The semiconductor memory device as claimed in claim 3, wherein the command decoder receives the external power supply detecting signal from the internal power supply voltage generator, and generates the mode register setting signal when the external power supply detecting signal is at the first level.

7. The semiconductor memory device as claimed in claim 1, wherein the deep power down mode controller includes:
    a third NAND gate for NANDing the intermediate deep power down mode entry signal from the command decoder and an output signal of the mode register setting latch circuit; and
    a fourth inverter for receiving and inverting an output signal from the third NAND gate.

8. The semiconductor memory device as claimed in claim 7, wherein the deep power down mode controller includes:
    a fifth inverter for receiving and inverting an output signal of the fourth inverter;
    an NMOS transistor, including a gate for receiving an output signal from the fifth inverter and a source that is grounded;

a latch section, including first and second input terminals which are connected to a drain of the NMOS transistor and to an output terminal of the fourth inverter, respectively; and a NOR gate for receiving the deep power down mode release signal and an output signal of the latch section as two inputs.

9. A semiconductor memory device with a mode register, the semiconductor memory device comprising:

a deep power down decoder for receiving external clock, clock enable, and command signals and for generating an intermediate deep power down mode entry signal instructing the semiconductor memory device to enter into a deep power down mode in response to a predetermined combination of the received external clock, clock enable, and command signals;

a mode register setting decoder for receiving the external clock and command signals, and for generating a mode register setting signal instructing a setting of the mode register in response to a predetermined combination of the received external clock and command signals;

a mode register setting latch circuit for latching the mode register setting signal from the mode register when the mode register setting signal is received after stabilization of an external power supply; and a deep power down mode controller for receiving the intermediate deep power down mode entry signal from the deep power down decoder, and for generating a final deep power down mode entry signal when the mode register setting signal is received from the command decoder.

10. The semiconductor memory device as claimed in claim 9, further comprising a clock buffer operating by an external power supply voltage, and for generating the deep power down mode release signal instructing the semiconductor memory to be released from a deep power down mode using the received external clock enable signal, and for providing the generated deep power down mode release signal to the deep power down mode controller.

11. The semiconductor memory device as claimed in claim 9, further comprising an internal power supply voltage generator for generating an external power supply voltage detecting signal at a first level when the external power supply voltage is stabilized, and for outputting the generated external power supply detecting signal to the mode register setting latch circuit.

12. The semiconductor memory device as claimed in claim 11, wherein the mode register setting latch circuit latches the mode register setting signal from the command decoder when the external power supply detecting signal is at the first level.

13. The semiconductor memory device as claimed in claim 12, wherein the mode register setting latch circuit includes:

a first inverter for receiving and inverting the external power supply detecting signal;

a first NAND gate for receiving an output signal of the first inverter as a first input signal;

a second inverter for receiving and inverting the mode register setting signal;

a second NAND gate for NANDing an output signal of the second inverter and an output signal of the first NAND gate to generate an output signal as a second input signal of the first NAND gate; and a third inverter for receiving and inverting an output signal from the first NAND gate and outputting the inverted signal as an output signal of the mode register setting latch circuit.

14. The semiconductor memory device as claimed in claim 11, wherein the mode register setting decoder receives the external power supply detecting signal from the internal power supply voltage generator, and generates the mode register setting signal when the external power supply detecting signal is at the first level.

15. The semiconductor memory device as claimed in claim 9, wherein the deep power down mode controller includes:

a third NAND gate for NANDing the intermediate deep power down mode entry signal from the command decoder and an output signal of the mode register setting latch circuit; and a fourth inverter for receiving and inverting an output signal of the third NAND gate.

16. The semiconductor memory device as claimed in claim 15, wherein the deep power down mode controller includes:

a fifth inverter for receiving and inverting an output signal of the fourth inverter;

an NMOS transistor including a gate for receiving an output signal of the fifth inverter and a source that is grounded;

a latch section including first and second input terminals which are connected to a drain of the NMOS transistor and an output terminal of the fourth inverter, respectively; and a NOR gate for receiving the deep power down mode release signal and an output signal of the latch section as two inputs.

17. A method for controlling a deep power down mode in a semiconductor memory device with a mode register, the method comprising the steps of:

(i) receiving external clock, clock enable, and command signals, and generating an intermediate deep power down mode entry signal instructing the semiconductor memory device to enter into a deep power down mode or a mode register setting signal commanding a setting of the mode register according to a predetermined combination of the received internal clock, clock enable, and external command signals;

(ii) latching the mode register setting signal when the mode register setting signal is received after a stabilization of the external power supply voltage; and (iii) generating a final deep power down mode entry signal when the intermediate deep power down entry and mode register setting signals are received.

18. The method as claimed in claim 17, further comprising generation of a deep power down mode release signal instructing the semiconductor memory device to be released from the deep power down mode using the external received clock enable signal, by an external power supply voltage.

19. The method as claimed in claim 17, further comprising the step of generating an external power supply voltage detecting signal having a first level when the external power supply voltage is stabilized, wherein step (iii) latches the mode register setting signal when the external power supply detecting signal has the first level.

20. The method as claimed in claim 17, further comprising the step of generating an external power supply voltage detecting signal at a first level when the external power supply voltage is stabilized, wherein step (iii) generates the mode register setting signal when the external power supply detecting signal is at the first level.

* * * * *